US 6,720,029 B2

(12) United States Patent
Fujita et al.

(10) Patent No.: US 6,720,029 B2
(45) Date of Patent: Apr. 13, 2004

(54) COATING LIQUID FOR FORMING ORGANIC LAYER IN ORGANIC LED DISPLAY AND METHOD OF MANUFACTURING ORGANIC LED DISPLAY (75) Inventors: Yoshimasa Fujita, Kashihara (JP); Yoshitaka Kawase, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/272,935

(22) Filed: Oct. 18, 2002

(65) Prior Publication Data

US 2003/0042472 A1 Mar. 6, 2003

Related U.S. Application Data (62) Division of application No. 09/629,838, filed on Jul. 31, 2000, now abandoned.

(30) Foreign Application Priority Data

Aug. 6, 1999 (JP) .............................. 11-224065

(51) Int. Cl.$^7$ .............................. B05D 5/12; H01B 1/20
(52) U.S. Cl. .................... 427/157; 252/500; 252/501.1; 252/301.16
(58) Field of Search ............................ 252/500, 501.1, 252/301.16; 362/800; 347/111; 427/64, 74, 77, 157, 256, 384

(56) References Cited

U.S. PATENT DOCUMENTS

| 5,583,169 A | 12/1996 | Wrobleski et al. | |
| 5,681,659 A | 10/1997 | Shi et al. | |
| 5,688,311 A | * 11/1997 | Adamic | 106/31.86 |
| 5,781,214 A | * 7/1998 | Vonasek et al. | 347/95 |
| 6,284,435 B1 | 9/2001 | Cao | |

FOREIGN PATENT DOCUMENTS

| JP | 10-012377 | 1/1998 |
| JP | 10-153967 | 6/1998 |
| JP | 11-054270 | 2/1999 |
| JP | 11-054272 | 2/1999 |
| JP | 11-074076 | 3/1999 |

OTHER PUBLICATIONS

The 59$^{th}$ Science Lecture of Appl. Phys. Soc., 16p–YH–15 "Fabrication of Organic Electroluminescent Devices by Direct Ink–Jet Printing Method" Toyama University K. Yyoshimori et al.

Appl. Phys. Letters. vol. 72, No. 21, pp. 2660–2662, May 1998 "Polymer Electroluminescent Devices Processed by Inkjet Printing: I. Polymer Light–Emitting Logo" J. Bharathan et al.

Bharathan et al., "Polymer Electroluminescent Devices", Appl. Phys. Lett. vol. 72, No. 21, pp 2660–2662, May 1998.

* cited by examiner

*Primary Examiner*—Mark Kopec
(74) *Attorney, Agent, or Firm*—Nixon & Vanderhye P.C.

(57) ABSTRACT

A coating liquid for forming an organic layer of an organic LED display which layer includes a light-emitting layer or a light-emitting layer and a charge-transporting layer, the liquid comprising: an organic material or a precursor thereof required for forming the organic layer, and at least one low volatile liquid solvent having a vapor pressure of 10 mmHg or less at 20° C. and a boiling point lower than a denaturing temperature of the organic material or lower than a converting temperature of the precursor.

9 Claims, 9 Drawing Sheets

COATING LIQUID FOR FORMING ORGANIC LAYER IN ORGANIC LED DISPLAY AND METHOD OF MANUFACTURING ORGANIC LED DISPLAY

CROSS-REFERENCE TO RELATED APPLICATION

This application is a division of application Ser. No. 09/629,838, filed Jul. 31, 2000 now abandoned, the entire content of which is hereby incorporated by reference in this application.

This application is related to Japanese application No. HEI 11 (1999)-224065 filed on Aug. 6, 1999, whose priority is claimed under 35 USC § 119, the disclosure of which is incorporated by reference in its entirety.

BACKGROUND OF THE INVENTION

1. Field of the Invention

The present invention relates to a coating liquid for forming an organic layer in an organic LED display and a method of manufacturing an organic LED display. More particularly, it relates to the manufacture of an organic LED display by an ink-jet technique, a coating liquid capable of preventing a nozzle from clogging and providing an organic LED display in a successive and stable manner, and a method of manufacturing an organic LED display using the coating liquid.

2. Description of Related Art

An organic LED display which includes a light-emitting layer of a polymer material has been manufactured by spin coating. However, since this technique cannot pattern the light-emitting layer, it has not been reported yet that the technique is applied for the formation of a full-color display panel.

Recently, however, as means of patterning the light-emitting layer, methods of manufacturing a light-emitting layer which produces the three primary colors by an ink-jet technique have been proposed (Japanese Unexamined Patent Publications Nos. HEI 10(1998)-12377, HEI 10(1998)-153967, HEI 11(1999)-54270 and HEI 11(1999)-54272, Appl. Phys. Lett. 72, 519, 1998, and Appl. Phys. Lett. 72, 2660, 1998).

Conventionally, highly volatile solvents such as dichloromethane, dichloroethane and methanol have mostly been used as solvents for dissolving the polymer material, though sometimes water has been used. Accordingly, when pixels are formed by the ink-jet technique using such solvents, the polymer material is dried very quickly after it is discharged. As a result, the resulting layer is not formed flat, which makes the light-emission of the organic LED display irregular.

Further, where the light-emitting layer is formed by discharging the coating liquid in plural times, the resulting layer will form interfaces therein because of the same reason described above. Thus, electrical characteristics are deteriorated.

In a field of conventional ink-jet printing, a solvent of low vapor pressure is used as measures for dealing with the above drawback. It is known that such a solvent of low vapor pressure has a high boiling point. In the usual printing, the solvent is absorbed into paper so that the existence of the remaining solvent is less significant. However, in the manufacture of the organic LED display, a coating liquid is discharged on a glass substrate or the like and the remaining solvent may cause deterioration of device characteristics. Therefore, the remaining solvent must be completely removed in the manufacture of the organic LED display. Thus, the solvent needs to be evaporated by heat drying (Japanese Unexamined Patent Publication No. HEI 11(1999)-54272). However, the publication employs a drying temperature of not higher than 120° C., at which the low volatile solvent cannot be completely removed.

When the solvent is removed by heat drying at a high temperature, the polymer material is also heated. As a result, the polymer material is decomposed or denatured, which leads to a destruction or deterioration of the device. Further, when a multi-layered film of polymer materials is formed, the material of the layer to be heated and that of a layer contacting it are mixed at an interface therebetween, which causes the deterioration of the device characteristics.

The formation of the organic LED display by the ink-jet technique has also suffered from clogging of a nozzle. To solve this clogging problem, Yoshimori et al. have proposed a method of mixing isopropylalcohol in the solvent (the 59th Science Lecture of Appl. Phys. Soc., 16p-YH-15). However, the clogging has not been completely prevented by this method.

SUMMARY OF THE INVENTION

The inventors of the present invention have deeply studied the above problems, and as a result, found that an organic layer with a flat surface and free from forming interfaces therein can be formed while preventing the clogging of the nozzle by using the ink-jet technique and a coating liquid containing an organic solvent of particular characteristics for forming an organic layer of an organic LED display. Further, it has also been found that the remaining solvent can be completely removed without the destruction and deterioration of the device by subjecting a film formed by using the coating liquid to a predetermined heating step, and thus the irregular light-emission can be dissolved.

According to the present invention, provided is a coating liquid for forming an organic layer of an organic LED display which layer includes a light-emitting layer or a light-emitting layer and a charge-transporting layer, the liquid comprising: an organic material or a precursor thereof required for forming the organic layer, and at least one low volatile liquid solvent having a vapor pressure of 10 mmHg or less at 20° C. and a boiling point lower than a denaturing temperature of the organic material or lower than a converting temperature of the precursor.

Further, according to the present invention, provided is a method of manufacturing an organic LED display comprising the steps of: discharging the above-mentioned coating liquid for forming the organic layer of the organic LED display by an ink-jet technique to form at least one film, and heat drying the film at a temperature not lower than the boiling point of a low volatile liquid solvent contained in the coating liquid, thereby forming the organic layer.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Hereinafter, the present invention will be detailed.

Figure 1:
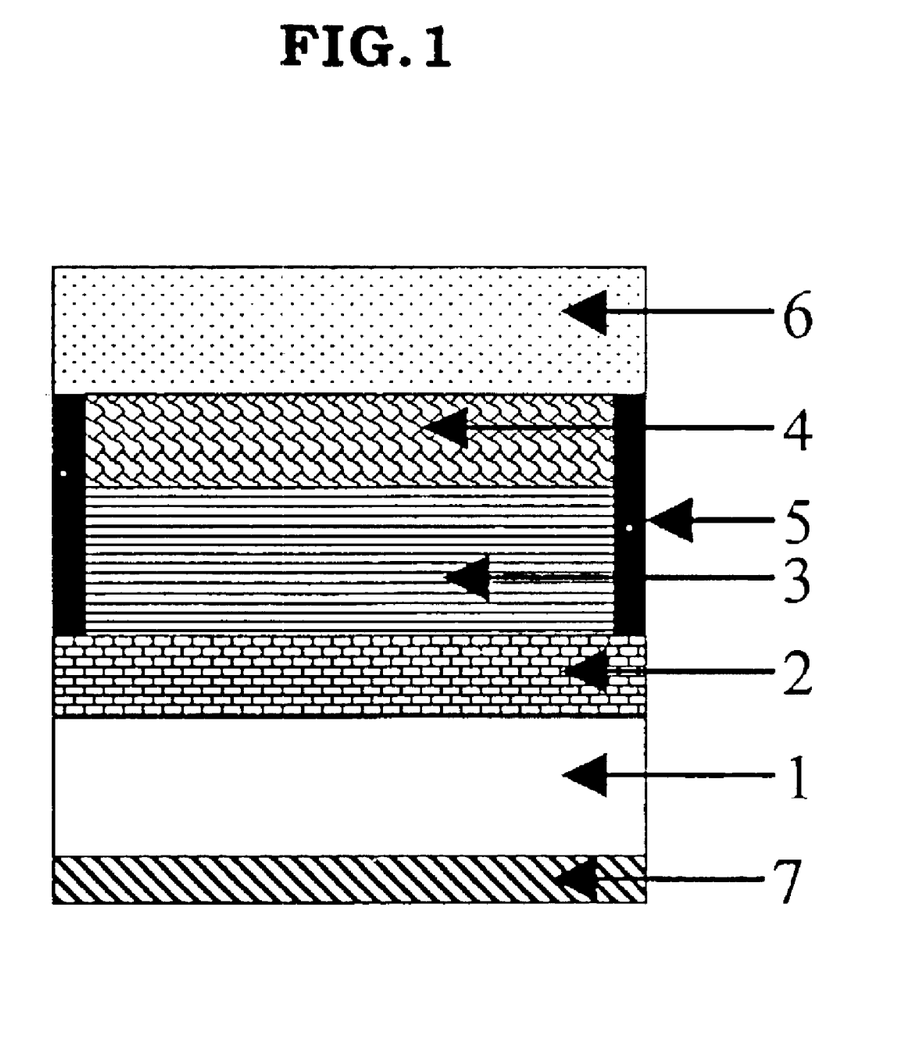
FIG. 1 is a schematic sectional view illustrating an organic LED display according to the present invention.

The organic LED display of the present invention is constructed as shown in FIG. 1, for example.

The organic LED display shown in FIG. 1 comprises a first electrode 2, an organic layer 3 contributing to the light-emission and a second electrode 4 formed on a substrate 1 in this order.

The organic layer 3 includes at least one light-emitting layer. More specifically, it may have a single-layered structure of a light-emitting layer or a multi-layered structure of an electric charge-transporting layer and a light-emitting layer. The charge-transporting layer and the light-emitting layer may each have a multi-layered structure. The present invention provides coating liquids for forming such organic layers in organic LED displays. Each coating liquid is for forming at least one organic layer.

The coating liquids for forming the organic layers of the organic LED displays according to the present invention are roughly grouped into coating liquids for forming the light-emitting layer and ones for forming the charge-transporting layer.

First, the coating liquid for forming the light-emitting layers may be prepared by dissolving or dispersing an organic material for forming the light-emitting layer having electrical conductivity, fluorescence or both of these characteristics or a precursor thereof into a solvent comprised of at least one low volatile liquid solvent.

By containing the low volatile liquid solvent, the coating liquid remains wet even after discharged onto the substrate, the electrode or the organic film. Thus, a flat film can be formed, which can eliminate the irregular light emission.

When the coating liquid is further discharged to contact the previously discharged coating liquid, the coating liquids can be blended in a wet state, so that the formation of interfaces that have customarily been generated within the film can be prevented. Thus, the deterioration of the electrical characteristics can be prevented.

Further, by containing the low volatile liquid solvent, the coating liquid becomes less volatile, and as a result, the nozzle can be prevented from clogging.

The solvent preferably has a boiling point of not higher than a temperature at which the organic material is denatured or a temperature at which the precursor converts. In this context, the denaturing temperature signifies a temperature causing an irreversible thermal damage to the characteristics of the organic material, when the organic material is heated and then cooled. An oxidizing temperature, a decomposing temperature and the like are mentioned as such temperatures. The converting temperature signifies a temperature at which the precursor converts into an intended organic material. For example, it may be a temperature at which a nonconjugated polymer having a substituent group of ionic thiophene converts to a conjugated polymer.

By heat drying the solvent having the above-mentioned boiling point to a temperature not higher than the denaturing temperature of the organic material or not lower than the converting temperature of the precursor and not lower than the boiling point of the low volatile solvent, the solvent remaining in the film can be completely dried off without giving any thermal damage such as decomposition or denaturation to the organic material. As a result, the electrical characteristics can be prevented from deterioration due to the remaining solvent.

The heat drying is preferably performed at a temperature not higher than a melting point of the organic material and not lower than the boiling point of the low volatile liquid solvent. Thus, the thermal damage to the organic material can fully be prevented.

Further, in the case where the organic layer is made of a multi-layered film, the remaining solvent can be removed at a lower temperature if the boiling temperature of the organic solvent is lower than the denaturing temperature or the converting temperature of any organic material or any precursor constituting the respective organic layers.

The organic material or the precursor may be a polymer light-emitting material for the organic layer of the organic LED display or a precursor thereof, or a known light-emitting low molecular material for the organic layer of the organic LED display.

Any known polymer material can be used as the polymer light-emitting material without any particular limitation. Examples thereof include PFO, poly(dialkylfluorene) (PDAF), RO-PPP, CN-PPP, poly[2,5-bis(N,N,N-triethylammonium) ethoxy-1,4-phenylene-ortho-1,4-phenylene]dibromide (PPP-NEt$_3^+$), poly[2-methoxy-5-(2'-ethylhexyloxy)-paraphenylenevinylene] (MEH-PPV), poly [5-methoxy(2-propoxysulfonide)-1,4-phenylenevinylene] (MPS-PPV), poly[2,5-bishexyloxy-1,4-phenylene(1-cyanovinylene)] (CN-PPV), polyalkylthiophene (PAT) and the like.

Any known material can be used as the low molecule light-emitting material without any particular limitation. Examples thereof include tetraphenylbutadiene (TPB), coumarin, Nile red, oxadiazole derivatives and the like.

The coating liquid may contain a polymer material that is not conductive and fluorescent. Examples thereof include polycarbonate (PC), polymethylmethacrylate (PMMA) and the like.

If required, to the coating liquid may be added additives such as a pH adjustor, a viscosity adjustor and a permeation promoter, charge-transporting materials as known hole-transporting materials for the organic LED display and an organic photoelectric conductor (e.g., N,N'-bis-(3-methylphenyl)-N,N'-bis-(phenyl)benzidine (TPD), N,N'-di(naphthalene-1-yl)-N,N'-diphenylbenzidine (NPD) and the like; but the invention is not limited thereto), and electron-transporting materials (e.g., oxydiazole derivatives (OXO), alumiquinolyl complex ($Alq_3$) and the like; but the invention is not limited thereto), a dopant such as an acceptor, a donor and the like.

The solvent in which the organic material or the precursor is dissolved or dispersed is at least one liquid solvent which is low volatile at a normal temperature and has a vapor pressure of not higher than 10 mmHg at 20° C. Examples of the organic solvent include, without any particular limitation, multivalent alcohols such as ethylene glycol, propylene glycol, triethylene glycol, ethyleneglycol monomethyl ether, ethyleneglycol monoethyl ether, triethyleneglycol monomethyl ether, triethyleneglycol monoethyl ether, glycerin and the like, their derivatives, amide compounds such as N,N-dimethylformamide and N-methyl-2-pyrrolidone, alicyclic ketones such as cyclohexanone, aliphatic alcohols such as 1-propanol, aliphatic hydrocarbons such as octane, nonane and decan, as well as benzene derivatives such as chlorobenzene, o-dichlorobenzene and o-xylene. These organic solvents can be used solely or in combination of plural ones.

The above solvent may contain an organic solvent having a vapor pressure greater than 10 mmHg at 20° C. Examples of such a organic solvent include methanol, dichloromethane, benzene and the like. The organic solvent having greater vapor pressure is preferably contained in an amount of 80 wt % or less in the solvent.

The add amount of the organic material for forming the light-emitting layer and its precursor to the solvent is preferably in the range of 10 to 0.01 wt %, though it varies depending on the solvent and the material used. An amount less than 0.01 wt % is not preferable since the viscosity becomes too low, and an amount of 10 wt % or more is not preferable since the viscosity becomes too high.

Next, the coating liquid for forming the charge-transporting layer can be prepared by dissolving or dispersing an organic material for forming the charge-transporting layer having conductivity, fluorescence or both of these characteristics or a precursor thereof into a solvent comprised of at least one organic solvent having a vapor pressure of 10 mmHg or less at 20° C.

As the organic material and the precursor, may be used known charge-transporting polymer materials for the organic LED display and the organic photoelectric conductor or precursors thereof, and known low molecular charge-transporting materials for the organic LED display and the organic photoelectric conductor.

Any known material can be used as the charge-transporting polymer material without any particular limitation. Examples thereof include PPV, polynaphthalenevinylene (PNV), polyaniline (PANI), 3,4-polyethlenedioxythiophene (PEDT), polyethylenedioxythiophene (PEDOT), polyvinylcarbazol (PVCz), poly TPD, polyoxydiazole derivatives (poly OXZ) and the like.

Any known material can be used as the precursor of the charge-transporting polymer material without any particular limitation. Examples thereof include a precursor of PPV (Pre-PPV), a precursor of PNV (Pre-PNV) and the like.

Any known material can be used as the charge-transporting low molecular material without any particular limitation. Examples thereof include TPD, NPD and oxydiazole derivatives.

The coating liquid may contain a polymer material that is not conductive and fluorescent, for example, PC and PMMA.

To the coating liquid may be added additives such as a pH adjustor, a viscosity adjustor and a permeation promoter, a dopant such as an acceptor or donor and the like.

The solvent may be any one of the organic solvents mentioned above for the coating liquid for forming the light-emitting layer.

The add amount of the organic material for forming the charge-transporting layer or its precursor in the solvent is preferably in the range of 10 to 0.01 wt %, though it varies depending on the solvent and the material used. The add amount smaller than 0.01 wt % is not preferable since the viscosity becomes too low, and the amount of 10 wt % or more is not preferable since the viscosity becomes too high.

The organic LED display shown in FIG. 1 preferably includes barriers 5 between pixels so as to prevent overlapping of the light-emitting layers and make the light-emitting layers uniform in thickness in the respective pixels. In view of contrast, a polarization plate 7 is preferably provided on an outer surface of the substrate. Further, in view of reliability, a sealing film or a sealing substrate 6 is preferably provided on the second electrode of the organic LED device.

Any known material can be used as the substrate 1 of the organic LED display shown in FIG. 1 without any particular limitation. For example, a quartz substrate, a glass substrate and a plastic substrate are mentioned.

The organic layer 3 comprises a single layer or multi layers, in which at least one layer is formed using the coating liquid for forming the organic layer of the organic LED display according to the invention.

In the case where the substrate and the first electrode are transparent, light generated by the organic layer is emitted out from the substrate side. Therefore it is preferable that the second electrode is a reflective electrode, or a reflective film is provided on the second electrode to increase a emission efficiency. On the contrary, the second electrode may be formed of a transparent material to emit out the light generated by the organic layer from the second electrode side. In this case, it is preferred that the first electrode is the reflective electrode, or the reflective film is disposed between the first electrode and the substrate.

The transparent electrode may be made of a transparent material such as CuI, ITO, $SnO_2$, ZnO or the like. The reflective electrode may be made of a metal such as aluminum, calcium or the like, an alloy of magnesium-silver, lithium-aluminum or the like, a laminated film of metals such as magnesium/silver, a laminated film of an insulator and a metal such as lithium fluoride/aluminum. Further, known metal films can be used as the reflective film.

The barrier 5 may be formed of a single layer or multi layers. The material for the barrier is preferably insoluble or hardly soluble to the organic layer of the present invention. For the purpose of improving the display quality, it is more preferred to use a material for black matrices.

Figure 2:
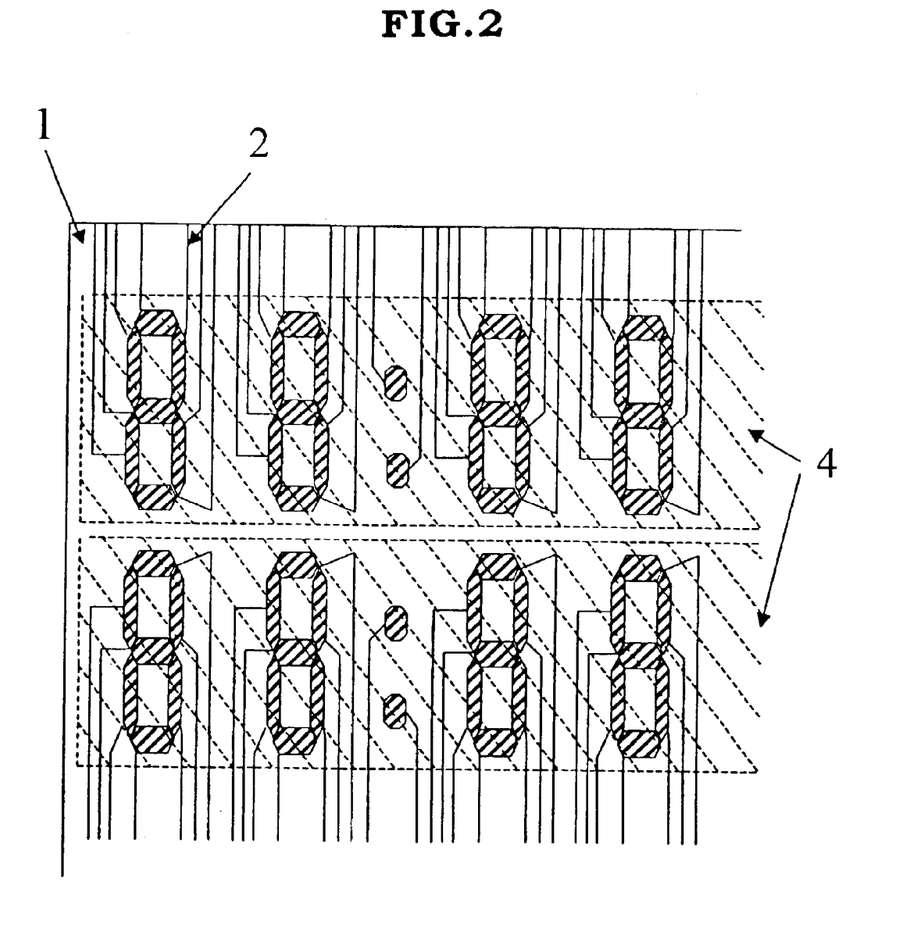
FIG. 2 is a schematic see-through plan view partially illustrating the organic LED display according to the present invention.
Figure 3:
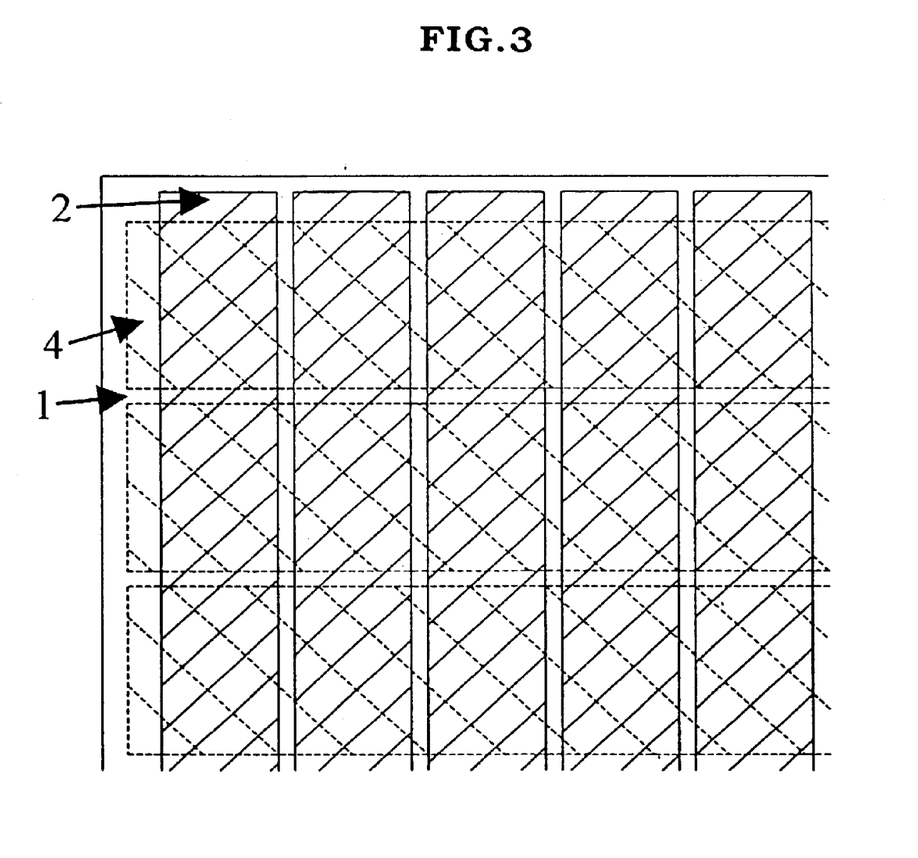
FIG. 3 is a schematic see-through plan view partially illustrating the organic LED display according to the present invention.
Figure 4:
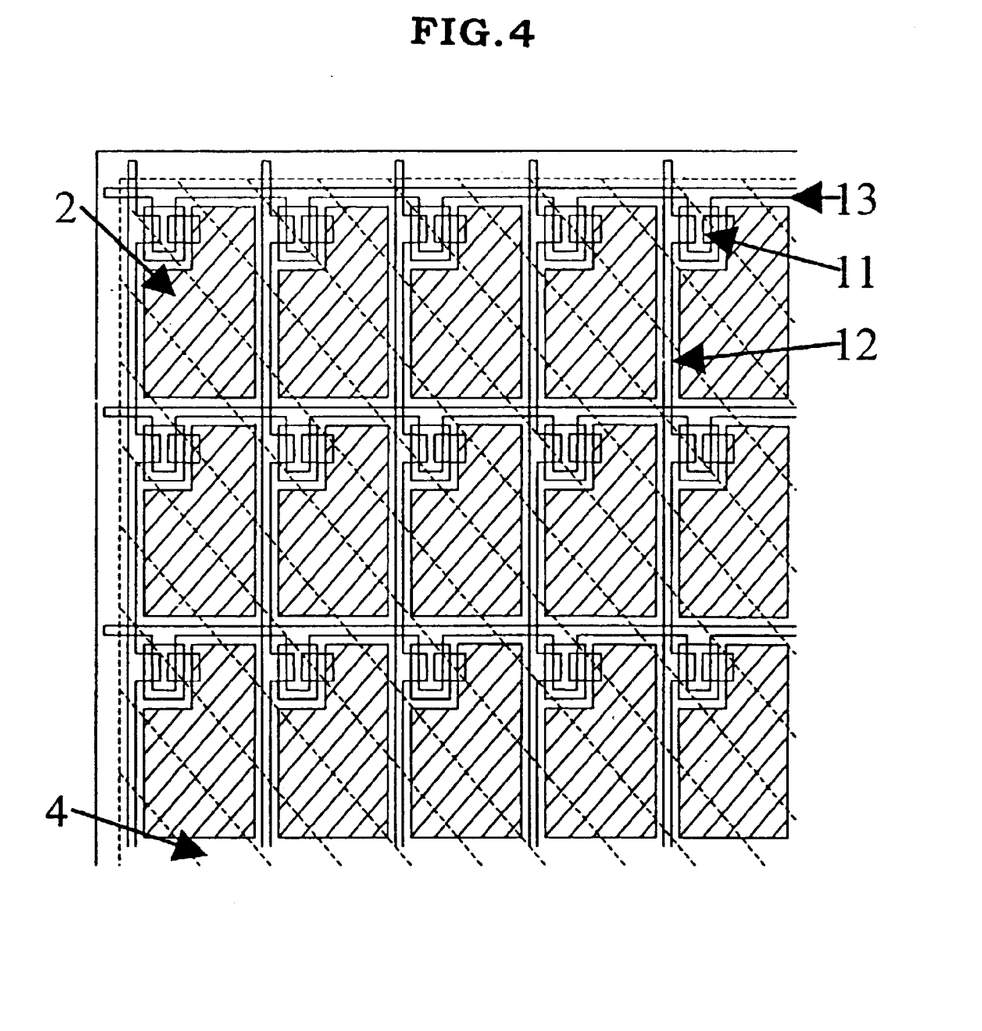
FIG. 4 is a schematic see-through plan view partially illustrating the organic LED display according to the present invention.

Next, a construction of the first electrodes and the second electrodes in the pixels will be described. The first electrode or the second electrode may be independently provided in each pixel. For example, as shown in FIG. 2, the first electrode is independently provided in each pixel, and the second electrode is provided with respect to the plural pixels. In FIG. 2, reference numeral 1 denotes the substrate, 2 the first electrode and 4 the second electrode. Further, as shown in FIG. 3, the first and second electrodes in a stripe arrangement corresponding to the organic layer may be provided orthogonally to each other on one common substrate. Still further, the first electrode or the second electrode may be connected with one common electrode (a source bus line or a gate bus line) through a thin film transistor (TFT). For example, as shown in FIG. 4, the first electrode is provided independently in each pixel and connected with each bus line through the TFT, and the second electrode is provided as one common electrode with respect to the plural pixels. In FIG. 4, reference numeral 11 denotes the TFT, 12 the source bus line, and 13 the gate bus line.

Next, the arrangement of the organic layer in the organic LED display will be described.

Figure 5:
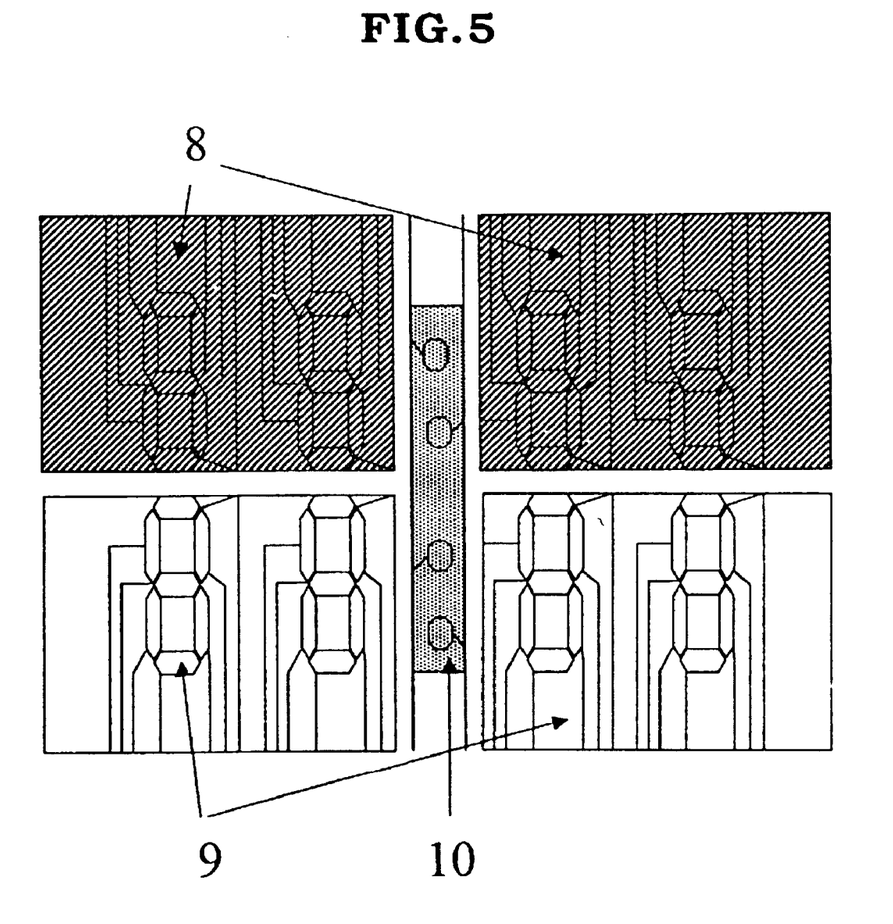
FIG. 5 is a schematic partial plan view illustrating an arrangement of a light-emitting layer of the organic LED display according to the present invention.

The organic LED display according to the present invention may include regions each having a different color of light as shown in FIG. 5. FIG. 5 shows an example in which the light-emitting layers are provided on the first electrodes of in FIG. 2. In this Figure, reference numeral 8 denotes a red light-emitting pixel, 9 a green light-emitting pixel and 10 a blue light-emitting pixel.

Figure 6:
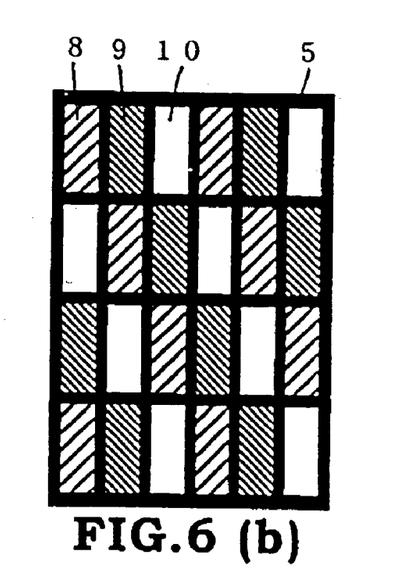
FIGS. 6(a) to (d) are a schematic partial plan view illustrating an arrangement of a light-emitting layer of the organic LED display according to the present invention.
Figure 6A:
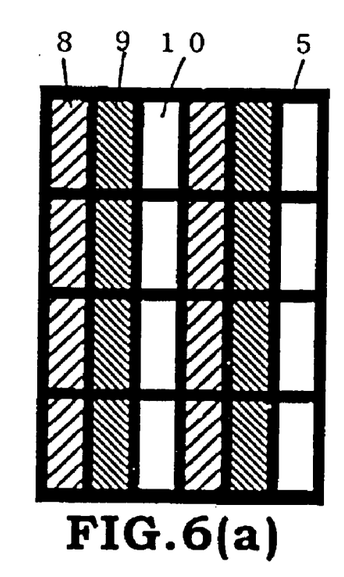

In addition to the construction shown in FIG. 5, the organic layers may be provided in a matrix arrangement and the thus arranged organic layers may each have the red (R) light-emitting pixel 8, the green (G) light-emitting pixel 9 or the blue (B) light-emitting pixel as shown in FIG. 6(*a*). The arrangement shown in FIG. 6(*a*) may be replaced with those shown in FIGS. 6(*b*) and 6(*c*). Further, as shown in FIG. 6(*d*), the pixels emitting light of red (R), green (G) and blue (B) may be arranged in a ratio other than 1:1:1. Still further, the pixels may have the same or different light emission area. The arrangement of FIG. 6(*a*) is referred to as a stripe arrangement, that of FIG. 6(*b*) is as a mosaic arrangement, that of FIG. 6(*c*) is as a delta arrangement, and that of FIG. 6(*d*) is as a square arrangement.

Figure 7:
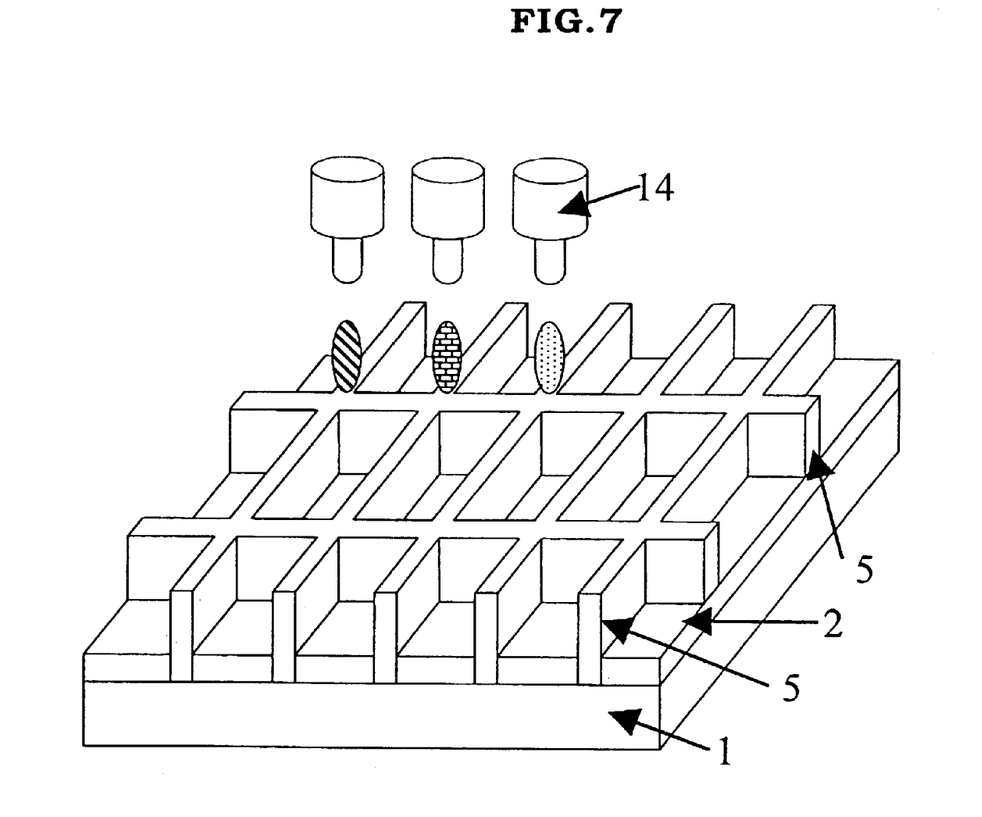
FIG. 7 is a schematic view illustrating a manufacturing process of an organic layer by an ink-jet technique according to the present invention.

Then, the method of manufacturing the organic layer according to the present invention will be described. In the present invention, the organic layer is preferably formed by the ink-jet technique as shown in FIG. 7. Reference numeral 14 in FIG. 7 denotes an ink-jet printer head. Where the organic layer of the present invention is a light-emitting layer, it can be formed by discharging the coating liquid for forming the light-emitting layer on the first electrode or the charge-transporting layer. On the other hand, where the organic layer of the present invention is a charge-transporting layer, it can be formed by discharging the coating liquid for forming the charge-transporting layer on the first electrode, the charge-transporting layer or the light-emitting layer.

In the present invention, as long as at least one of the organic layers is formed by the ink-jet technique, the other layers constituting the organic layer may be formed by any other methods. Such methods include known methods (for example, dry process such as vacuum deposition and wet process such as dip coating or spin coating) in addition to the method of the present invention.

Where the organic LED display having a multi-layered organic film is formed, it is preferred that a solvent for forming a layer on a previously formed layer does not dissolve this underlying layer so that the mixing of the materials between the layers is prevented.

Figure 8:
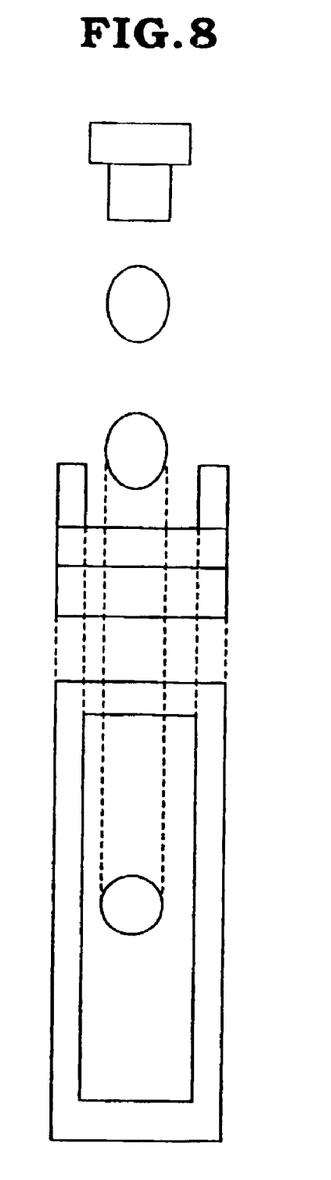
FIG. 8 shows a schematic partial sectional view and a schematic partial plan view illustrating the manufacturing process of the organic layer by the ink-jet technique according to the present invention.
Figure 9:
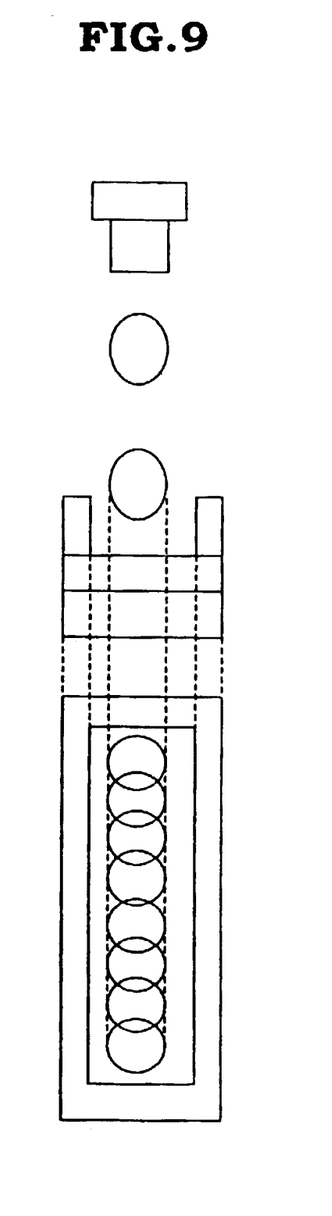
FIG. 9 shows a schematic partial sectional view and a schematic partial plan view illustrating the manufacturing process of the organic layer by the ink-jet technique according to the present invention.

To form one pixel, one drop of coating liquid may be discharged, or multiple drops of the coating liquid may be discharged on the same position as shown in FIG. 8 or on the different positions as shown in FIG. 9.

The nozzle for discharging the coating liquid is preferably changed for every color of light. Furthermore, plural nozzles are preferably used for one color of light in view of manufacturing speed. The discharging of the liquid may be continuous type or on-demand type depending on the arrangement of the light-emitting pixels of each color. A piezo type is more preferable to prevent thermal denaturation of the coating liquid in which the organic light-emitting material or the precursor is dissolved or dispersed.

The heat drying may be performed to every layer, or after forming the multi-layers, or after forming the negative electrode as long as the conditions of the present invention are satisfied.

More specifically, where the organic layer is made of a single layer, it needs to be heat dried at a temperature not lower than the boiling point of the organic solvent which is low volatile at normal temperature. Preferably, it is heat dried at a temperature not lower than the highest boiling point of the solvents used. More preferably, it is heated to dryness at a temperature not lower than the highest boiling point of the solvents and lower than the denaturing temperature of the organic material. Still more preferably, it is heated to dryness at a temperature not lower than the highest boiling point of the solvents and lower than the melting point of the organic material.

The heat drying may be performed under atmospheric air or inert gas. The heat drying under inert gas is preferable for avoiding oxidization of the material. It may also be performed under atmospheric pressure or reduced pressure.

Where the organic layer is made of two layers contacting each other, the heat drying temperature is preferably lower than the higher one of the melting points of the organic materials constituting the two layers. Thus the mixing of the materials therebetween can be prevented, and as a result, the deterioration of the electrical characteristics of the device can be prevented.

Where the organic layer is made of three or more layers, pluralities of interfaces are present in the organic layer. The heat drying temperature is preferably lower than the lowest one among the higher ones of the melting points of the organic materials of all pairs of two contacting layers. Thus, the mixing of the materials between the layers can be prevented, and as a result, the deterioration of the electrical characteristics of the device can be prevented.

More specifically, in the case where two layers of the organic materials each having the melting point of 200° C. and 160° C. are laminated on the ITO, for example, the higher one of the melting points of the two layers is 200° C. Therefore, the heating temperature is lower than 200° C.

Further, in the case where three layers of the organic materials each having the melting point of 180° C. (layer A), 200° C. (layer B) and 160° C. (layer C) are laminated on the ITO, the organic material layers A and B contact each other, and the organic materials layers B and C contact each other. The higher melting point between the layers A and B, and that between the layers B and C are 200° C. and 200° C., respectively. Therefore, the heating temperature is lower than 200° C.

As another example of the three-layered structure, where the organic material layers each having the melting point of 180° C. (layer A'), 160° C. (layer B') and 200° C. (layer C') are laminated on the ITO, the organic material layers A' and B' contact each other, and the organic materials layers B' and C' contact each other. The higher melting point between the layers A' and B', and that between the layers B' and C' are 180° C. and 200° C., respectively. Therefore, the lower melting point is 180° C., and thus the heating temperature is lower than 180° C.

EXAMPLES

Hereinafter, the present invention will be more detailed by way of examples, but the invention is not limited thereto.

Example 1

A glass substrate of 20×50 mm with a 150 nm thick ITO film was subjected to photolithography method to form three ITO transparent stripe electrodes having a width of 2 mm and a pitch of 4 mm as positive electrodes.

Then, the glass substrate was subjected to ultrasonic cleaning steps with isopropylalcohol, acetone and pure water for 10 minutes each, an UV ozone treatment for 10 minutes, and an $O_2$ plasma treatment for 10 minutes.

Then, a coating liquid for forming a green light-emitting layer was prepared by dissolving 0.6 g PC, 0.14 g NPD, 0.12 g TPB and 0.14 g PBD into 9 g chlorobenzene.

Using the coating liquid and a commercially available ink-jet printer, a light-emitting layer of 100 nm thick was formed on the glass substrate.

Subsequently, a LiF layer of 0.9 nm thick was formed on the light-emitting layer by vapor deposition and Al electrodes having a thickness of 0.2 μm, a width of 2 mm and a pitch of 2 mm were formed as negative electrodes by vapor deposition using a shadow mask. Thus, an organic LED display was obtained.

The obtained organic LED display was encapsulated with epoxy resin.

Comparative Example 1

An organic LED display was obtained in the same manner as in Example 1 except that 9 g of dichloromethane was used instead of chlorobenzene.

Example 2

An organic LED display was obtained in the same manner as in Example 1 except that a thermal treatment at 60° C. for 30 minutes was performed after the light-emitting layer was formed.

Example 3

An organic LED display was obtained in the same manner as in Example 1 except that a thermal treatment at 150° C. for 30 minutes was performed after the light-emitting layer was formed.

Example 4

An organic LED display was obtained in the same manner as in Example 1 except that 9 g of o-dichlorobenzene was used instead of chlorobenzene.

Example 5

An organic LED display was obtained in the same manner as in Example 4 except that a thermal treatment at 100° C. for 30 minutes was performed after the light-emitting layer was formed.

Example 6

An organic LED display was obtained in the same manner as in Example 4 except that a thermal treatment at 190° C. for 30 minutes was performed after the light-emitting layer was formed.

Example 7

An organic LED display was obtained in the same manner as in Example 4 except that a thermal treatment at 360° C. for 30 minutes was performed after the light-emitting layer was formed.

Example 8

A glass substrate of 20×50 mm with a 150 nm thick ITO film was subjected to photolithography method to form three ITO transparent stripe electrodes having a width of 2 mm and a pitch of 4 mm as positive electrodes.

Then, the glass substrate was subjected to ultrasonic cleaning steps with isopropylalcohol, acetone and pure water for 10 minutes each, an UV ozone treatment for 10 minutes, and an $O_2$ plasma treatment for 10 minutes.

Then, a coating liquid for forming a hole-transporting layer was prepared by dissolving 0.8 g PC and 0.2 g NPD into 9 g chlorobenzene.

Using the coating liquid and a commercially available ink-jet printer, a hole-transporting layer of 80 nm thick was formed on the glass substrate.

Subsequently, a coating liquid for forming a green light-emitting layer was prepared by dissolving and dispersing 0.6 g polyethylene oxide, 0.14 g NPD, 60.12 g carbon and 0.14 g PBD into 9 g o-xylene.

Using the thus prepared coating liquid and a commercially available ink-jet printer, a light-emitting layer of 60 nm thick was formed on the hole-transporting layer.

Then, a coating liquid for forming a electron-transporting layer was prepared by dissolving 0.8 g PC and 0.2 g PBD into 9 g chlorobenzene.

Using the coating liquid and a commercially available ink-jet printer, a electron-transporting layer of 80 nm thick was formed on the light-emitting layer.

Then, a LiF layer of 0.9 nm thick was formed on the electron-transporting layer by vapor deposition and Al electrodes of 0.2 μm thick and 2 mm wide having a pitch of 2 mm were formed as negative electrode by vapor deposition using a shadow mask. Thus, an organic LED display was obtained.

The obtained organic LED display was encapsulated with epoxy resin.

Example 9

An organic LED display was obtained in the same manner as in Example 8 except that a thermal treatment at 190° C. for 30 minutes was performed after forming the electron-transporting layer.

Example 10

An organic LED display was obtained in the same manner as in Example 8 except that a thermal treatment at 250° C. for 30 minutes was performed after forming the electron-transporting layer.

Example 11

A glass substrate of 20×50 mm with a 150 nm thick ITO film was subjected to photolithography method to form three ITO transparent stripe electrodes having a width of 2 mm a pitch of 4 mm as positive electrodes.

Then, the glass substrate was subjected to ultrasonic cleaning steps with isopropylalcohol, acetone and pure water for 10 minutes each, an UV ozone treatment for 10 minutes, and an $O_2$ plasma treatment for 10 minutes.

Then, a coating liquid for forming a green light-emitting layer was prepared by dissolving 0.01 g Pre-PPV into a 9.99 g solvent mixture of methanol and cyclohexanol in a ratio of 70:30 (weight ratio).

Using the coating liquid and a commercially available ink-jet printer, a light-emitting layer of 100 nm thick was formed on the glass substrate.

Then, Pre-PPV was converted into PPV by heating at 180° C. under nitrogen atmosphere for 2 hours.

Subsequently, $Alq_3$ was deposited to a thickness of 60 nm on the light-emitting layer by vacuum evaporation to form a electron-transporting layer.

Then, a 0.9 nm thick LiF layer was formed on the electron-transporting layer by vapor deposition and Al electrodes of 0.2 μm thick and 2 mm wide having a pitch of 2 mm were formed as negative electrode by vapor deposition using a shadow mask. Thus, an organic LED display was obtained.

The obtained organic LED display was encapsulated with epoxy resin.

Comparative Example 2

An organic LED display was obtained in the same manner as in Example 11 except that 9.99 g methanol was used instead of the solvent mixture of methanol and cyclohexanol.

Example 12

An organic LED display was obtained in the same manner as in Example 11 except that a 9.99 g solvent mixture of methanol and glycerin in a ratio of 70:30 was used instead of the solvent mixture of methanol and cyclohexanol.

Example 13

A glass substrate of 20×50 mm with a 150 nm thick ITO film was subjected to photolithography method to form three ITO transparent stripe electrodes having a width of 2 mm and a pitch of 4 mm as positive electrodes.

Then, the glass substrate was subjected to ultrasonic cleaning steps with isopropylalcohol, acetone and pure water for 10 minutes each, an UV ozone treatment for 10 minutes, and an $O_2$ plasma treatment for 10 minutes.

Then, a hole-transporting layer of 60 nm thick was formed on the glass substrate by spin coating using a solution prepared by dissolving 1 g 3,4-polyethylenedioxythiophene (abbreviated as PEDT) into 9 g methanol.

Subsequently, a coating liquid for forming a red light-emitting layer was prepared by dissolving 0.01 g PAT into 9.99 g o-xylene.

Using the coating liquid and a commercially available ink-jet printer, a light-emitting layer of 100 nm thick was formed on the hole-transporting layer.

Then, a LiF layer of 0.9 nm thick was formed on the light-emitting layer and Al electrodes of 0.2 μm thick and 2 mm wide having a pitch of 2 mm were formed as negative electrode by vapor deposition using a shadow mask. Thus, an organic LED display was obtained.

The obtained organic LED display was encapsulated with epoxy resin.

Comparative Example 3

An organic LED display was obtained in the same manner as in Example 13 except that 9.99 g benzene was used instead of o-xylene.

Comparative Example 4

An organic LED display was obtained in the same manner as in Comparative Example 3 except that a thermal treatment at 140° C. for 30 minutes was performed after forming the light-emitting layer.

Example 14

An organic LED display was obtained in the same manner as in Example 13 except that a thermal treatment at 160° C. for 30 minutes was performed after forming the light-emitting layer.

To the displays formed in the above examples, a direct voltage of 200 mA/cm² was applied and brightness was measured as an electrical characteristic. Table 1 shows the results.

Table 1 also shows the results of discharging tests conducted with the coating liquids formed in the above examples and the ink-jet printer. The evaluation of the discharging test was expressed with ○ for the case without any discharge failure in 100 dischargings and × for the case with discharge failure in less than 100 dischargings.

TABLE 1

| | Organic solvent | | | Organic material | | | Electrical | |
| | | | | | Melting point/ | | | |
| | Organic solvent | Boiling point (° C.) | Vapor pressure (mm Hg) | Organic material | denaturing temperature (° C.) | Heating temperature (° C.) | characteristic brightness (cd/m²) | Discharge test |
|---|---|---|---|---|---|---|---|---|
| Ex. 1 | Chlorobenzene | 132 | 8.99 | PC | 210/330 | — | 28 | ○ |
| Com. Ex. 2 | Dichloromethane | 40 | 356 | PC | 210/330 | — | 24 | X |
| Ex. 2 | Chlorobenzene | 132 | 8.99 | PC | 210/330 | 60 | 64 | ○ |
| Ex. 3 | Chlorobenzene | 132 | 8.99 | PC | 210/330 | 150 | 156 | ○ |
| Ex. 4 | o-Dichlorobenzene | 180 | 1.00 | PC | 210/330 | — | 26 | ○ |
| Ex. 5 | o-Dichlorobenzene | 180 | 1.00 | PC | 210/330 | 100 | 60 | ○ |
| Ex. 6 | o-Dichlorobenzene | 180 | 1.00 | PC | 210/330 | 190 | 152 | ○ |
| Ex. 7 | o-Dichlorobenzene | 180 | 1.00 | PC | 210/330 | 360 | 40 | ○ |
| Ex. 8 | o-Dichlorobenzene | 180 | 1.00 | PC | 210/330 | — | 178 | ○ |
| | o-Xylene | 142 | 4.87 | PEO | 150/300 | | | ○ |
| | o-Dichlorobenzene | 180 | 1.00 | PC | 210/330 | | | ○ |

TABLE 1-continued

| | Organic solvent | | | Organic material | | Electrical | | |
|---|---|---|---|---|---|---|---|---|
| | Organic solvent | Boiling point (° C.) | Vapor pressure (mm Hg) | Organic material | Melting point/ denaturing temperature (° C.) | Heating temperature (° C.) | characteristic brightness (cd/m²) | Discharge test |
| Ex. 9 | o-Dichlorobenzene | 180 | 1.00 | PC | 210/330 | 190 | 340 | ○ |
| | o-Xylene | 142 | 4.87 | PEO | 150/300 | | | ○ |
| | o-Dichlorobenzene | 180 | 1.00 | PC | 210/330 | | | ○ |
| Ex. 10 | o-Dichlorobenzene | 180 | 1.00 | PC | 210/330 | 250 | 140 | ○ |
| | o-Xylene | 142 | 4.87 | PEO | 150/300 | | | ○ |
| | o-Dichlorobenzene | 180 | 1.00 | PC | 210/330 | | | ○ |
| Ex. 11 | Methanol | 65 | 97.3 | Pre-PPV | >300 | 180 | 1200 | ○ |
| | Cyclohexanol | 161 | 0.9 | | | | | |
| Com. Ex. 2 | Methanol | 65 | 97.3 | Pre-PPV | >300 | 180 | 300 | X |
| Ex. 12 | Methanol | 65 | 97.3 | Pre-PPV | >300 | 180 | 250 | ○ |
| | Glycerin | 290 | 0.000006 | | | | | |
| Ex. 13 | o-Xylene | 142 | 4.87 | PAT | >300 | — | 170 | ○ |
| Ex. 14 | o-Xylene | 142 | 4.87 | PAT | >300 | 160 | 350 | ○ |
| Com. Ex. 3 | Benzene | 80 | 75.2 | PAT | >300 | — | 160 | X |
| Com. Ex. 4 | Benzene | 80 | 75.2 | PAT | >300 | 140 | 180 | X |

Table 1 shows that the coating liquid using a solvent having vapor pressure of 10 mmHg or less at 20° C. does not cause the clogging of the nozzle and thus the coating liquid is suitable for the use with the ink-jet printer.

The comparison of Example 1 and Comparative Example 1 and that of Example 13 and Comparative Example 3 show that the light-emitting layer can be formed by the ink-jet printer without deteriorating the brightness.

Further, the comparison of Examples 2 and 3, Examples 4 to 7, Examples 8 and 9, and Examples 13 and 14 indicate that the heat drying at a temperature lower than the denaturing temperature of the organic material can improve the brightness.

Example 15

A glass substrate with a 130 nm thick ITO film was subjected to photolithography method to form ITO transparent stripe electrodes of 200 μm wide having a pitch of 220 μm as positive electrodes.

Then, the glass substrate was subjected to ultrasonic cleaning steps with isopropylalcohol, acetone and pure water for 10 minutes each, an UV ozone treatment for 10 minutes, and an $O_2$ plasma treatment for 10 minutes.

Using photosensitive polyimide and a photoresist technique, barriers of 40 μm wide and 5 μm thick were formed in a lattice form at a pitch of 220 μm in a direction parallel with the transparent electrodes and at a pitch of 320 μm in a direction orthogonal to the transparent electrodes.

Then, a blue light-emitting layer in a stripe form was formed on the glass substrate in the same manner as in Example 3.

Subsequently, a green light-emitting layer was formed on the glass substrate in the same manner as in Example 11 to be in parallel with the blue light-emitting layer.

Then, a red light-emitting layer was formed on the glass substrate in the same manner as in Example 14 to be in parallel with the blue light-emitting layer.

Then, a 0.9 nm thick LiF layer was formed on the light-emitting layers by vapor deposition and Al electrodes of 0.2 μm thick and 300 μm wide having a pitch of 320 μm were formed as negative electrode by vapor deposition using a shadow mask. Thus, an organic LED display was obtained.

The obtained organic LED display was encapsulated with epoxy resin.

In the thus formed organic LED display, an electrical short was not observed between the positive electrodes and the negative electrodes. By applying a pulse voltage of 40V to the obtained organic LED display, lights of red, green and blue were observed.

Example 16

Thin film transistors were formed on a glass substrate and then positive electrodes and barriers were formed in the same manner as in Example 15.

Then, blue, green and red light-emitting layers were formed in the same manner as in Example 15.

Subsequently, a 0.9 nm thick LiF layer was formed on the light-emitting layers by vapor deposition and Al electrodes of 0.2 μm thick and 300 μm wide having a pitch of 320 μm were formed by vapor deposition using a shadow mask. Thus, an organic LED display was obtained.

The obtained organic LED display was encapsulated with epoxy resin.

By applying a direct voltage of 5 V to the thus formed organic LED display, lights of red, green and blue were observed.

According to the present invention, the coating liquid can remain wet even after discharged onto the substrate, the electrode or the organic film by using at least one low volatile liquid solvent having vapor pressure of 10 mmHg or less at 20° C.

As a result, a flat film can be formed, which enables the irregular light emission to be eliminated. Further, when the coating liquid is further discharged to contact the previously discharged coating liquid, the coating liquids can be blended in a wet state, so that the formation of interfaces that have customarily been generated within the film can be prevented. Thus, the deterioration of the electrical characteristics caused by the interfaces can be prevented.

Further, by containing the above solvent, the coating liquid becomes less volatile, which can prevent the nozzle from clogging.

Where the liquid organic solvent which is low volatile at normal temperature has the boiling point lower than the denaturing temperature of the organic material or the converting temperature of the precursor, the solvent remaining in the film can be completely dried off without giving any thermal damage such as decomposition or denaturation, by heat drying at a temperature lower than the denaturing temperature of the organic material or not lower than the converting temperature of the precursor. As a result, the deterioration of the electrical characteristics due to the remaining solvent can be prevented.

Where the boiling point of the liquid organic solvent which is low volatile at normal temperature is lower than the melting point of the organic material, the electrical characteristics can completely be prevented from the deterioration.

Further, when the organic layer is made of a multi-layered film, by setting the boiling point of the organic solvent lower than the lowest one of the denaturing temperatures of the organic materials forming each layer or the converting temperatures of the precursors, the remaining solvent can completely be removed by heating at a temperature lower than in a conventional technique.

In the formation of an organic LED display having a two-layered film including at least one organic layer formed by using the coating liquid of the present application and the ink-jet technique, the mixing of the materials of the two contacting layers can be prevented by setting the heat drying temperature lower than the higher one of the melting points of organic material comprising two layers contacting each other and by satisfying above condition. Thus the electrical characteristics of the device can be prevented from the deterioration.

Further, in an organic LED display having an organic layer of three or more layers including at least one organic layer formed by using the coating liquid of the present invention and the ink-jet technique, a plurality of interfaces are present between the layers contacting each other. Therefore, the heat drying temperature is set lower than the lowest one among the higher ones of the melting points of the organic materials of all pairs of two contacting layers. Thus, the mixing of the layer materials between the layers can be prevented, and as a result, the deterioration of the electrical characteristics of the device can be prevented.

As described above, the present invention can be a solution to the deterioration of the electrical characteristics due to the poor surface configuration, the interfaces formed within the layer, the remaining solvent and the clogging of the nozzle of the ink-jet printer that have been problematic to the organic LED display manufactured by the conventional ink-jet technique. Thus, an organic LED display excellent in electrical characteristics can be easily produced with reduced costs.

What is claimed is:

1. A method of manufacturing organic LED display including ink jet forming a light emitting organic layer, the method comprising:

providing a coating liquid comprising (a) an organic material having at least one of conductivity and fluorescence, and (b) at least one low volatile liquid solvent having a vapor pressure of 10 mmHg of less at 20° C. and a boiling point lower than a denaturing temperature of the organic material and wherein the low volatile liquid solvent has a boiling point lower than the melting point of the organic material;

ink-jet discharging the liquid by an ink-jet technique to form at least one film, and heat drying the film at a temperature not lower than the boiling point of a low volatile liquid solvent contained in the coating liquid, thereby forming the organic layer.

2. A method according to claim 1, wherein the heat drying is performed at a temperature lower than the denaturing temperature of the organic material.

3. A method according to claim 1, wherein, in the case where the organic LED display includes two organic layers of organic materials contacting each other and at least one of the organic layers is formed by the ink-jet technique, the heat drying is performed at a temperature lower than the higher one of the melting points of the two organic materials of the organic layers.

4. A method according to claim 1, wherein, in the case where the organic LED display includes three or more organic layers of organic materials and at least one of the organic layers is formed by the ink-jet technique, the heat drying is performed at a temperature lower than the lowest one among the higher ones of the melting points of the organic materials of all pairs of two contacting layers.

5. A method of manufacturing an organic LED display including ink-jet forming an organic layer of the LED display, wherein the organic layer includes at least a light emitting layer, the method comprising:

providing a coating liquid comprising a precursor of an organic material having conductivity and/or fluorescence for forming the organic layer, and at least one low volatile liquid solvent having a vapor pressure of 10 mmHg of less at 20° C. and a boiling point lower than a converting temperature of the precursor of the organic material, and wherein the low volatile liquid solvent has a boiling point lower than the melting point of the organic material, discharging the coating liquid by an ink-jet technique to form at least one film, and heat drying the film at a temperature not lower than the boiling point of a low volatile liquid solvent in the coating liquid, thereby forming the organic layer.

6. A method according to claim 5, wherein the heat drying is performed at a temperature of lower than the converting temperature of the precursor of the organic material.

7. A method according to claim 5, wherein the heat drying is performed at a temperature lower than the denaturing temperature of the organic material.

8. A method according to claim 5, wherein, in the case where the organic LED display includes two organic layers of organic materials contacting each other and at least one of the organic layers is formed by the ink-jet technique, the heat drying is performed at temperature lower than the higher one of the melting points of the two organic materials of the organic layers.

9. A method according to claim 5, wherein, in the case where the original LED display includes three or more organic layers of organic materials and at least one of the organic layers is formed by the ink jet technique, the heat drying is performed at a temperature lower than the lowest one among the higher ones of the melting points of the organic materials of all pairs of two contacting layers.

* * * * *